US012604748B2

(12) United States Patent
Darmawikarta et al.

(10) Patent No.: US 12,604,748 B2
(45) Date of Patent: Apr. 14, 2026

(54) CAPACITOR PADS AND METHODS OF MANUFACTURING THE SAME

(71) Applicant: Intel Corporation, Santa Clara, CA (US)

(72) Inventors: Kristof Darmawikarta, Chandler, AZ (US); Jung Kyu Han, Chandler, AZ (US); Srinivas Pietambaram, Chandler, AZ (US); Rajeev Ranjan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1059 days.

(21) Appl. No.: 17/448,288

(22) Filed: Sep. 21, 2021

(65) Prior Publication Data

US 2023/0085698 A1     Mar. 23, 2023

(51) Int. Cl.
| | |
|---|---|
| *H01L 21/48* | (2006.01) |
| *H01L 23/498* | (2006.01) |
| *H10D 1/68* | (2025.01) |
| *H01L 25/16* | (2023.01) |

(52) U.S. Cl.
CPC .... *H01L 23/49838* (2013.01); *H01L 21/4853* (2013.01); *H10D 1/68* (2025.01); *H01L 23/49816* (2013.01); *H01L 25/16* (2013.01)

(58) Field of Classification Search
CPC .............................. H10D 1/68; H01L 21/4853
See application file for complete search history.

(56) References Cited

U.S. PATENT DOCUMENTS

| | | | | |
|---|---|---|---|---|
| 5,635,421 A * | 6/1997 | Ting | ..................... | H10D 84/212 |
| | | | | 438/941 |
| 5,817,533 A * | 10/1998 | Sen | ......................... | H01L 22/22 |
| | | | | 257/E21.526 |
| 6,387,753 B1 * | 5/2002 | Clark | ....................... | H10D 1/68 |
| | | | | 438/957 |
| 2014/0376195 A1 * | 12/2014 | Zhang | .................. | H05K 3/4682 |
| | | | | 361/748 |
| 2019/0006264 A1 * | 1/2019 | Vaidya | .............. | H01L 21/76898 |

* cited by examiner

*Primary Examiner* — Ali Naraghi
(74) *Attorney, Agent, or Firm* — Hanley, Flight & Zimmerman, LLC

(57)     ABSTRACT

Capacitor pads and methods of manufacturing the same are disclosed herein. An example apparatus disclosed herein includes a substrate to support a die, and a die-side capacitor pad on the substrate, the die-side capacitor pad including a plurality of distinct pad portions, the distinct pad portions spaced apart from one another.

17 Claims, 9 Drawing Sheets

400

402

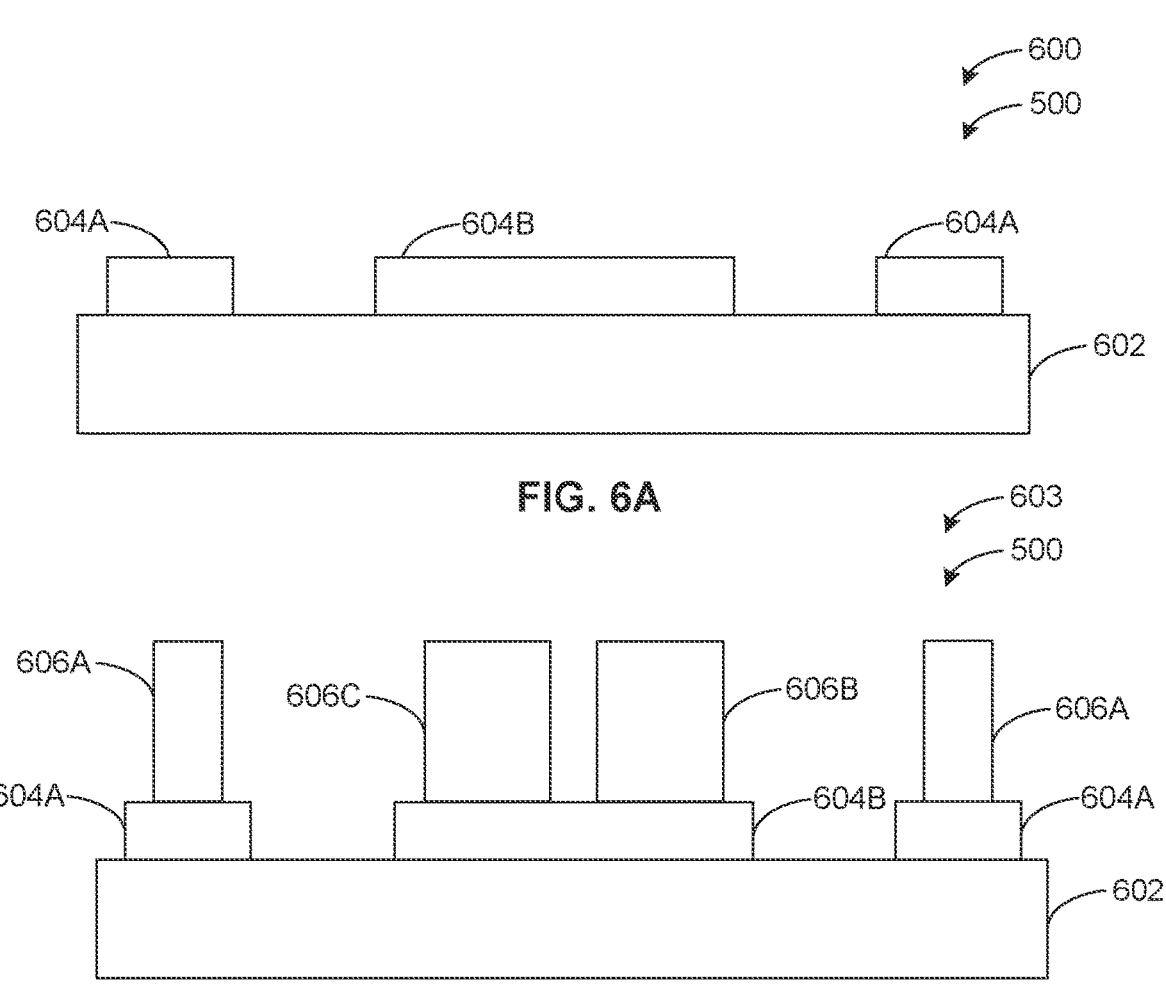
FIG. 6A
FIG. 6B
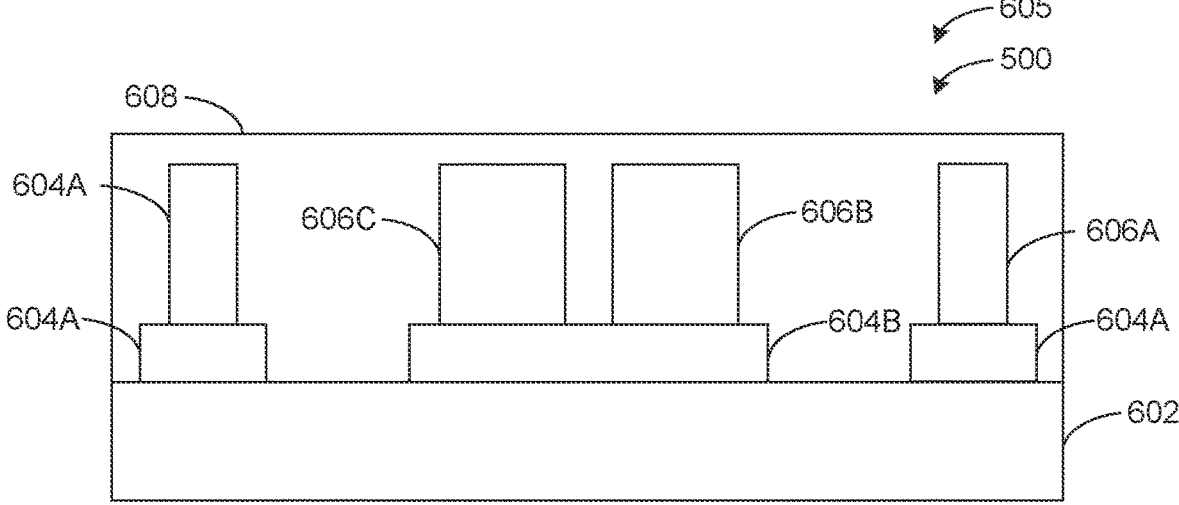
FIG. 6C

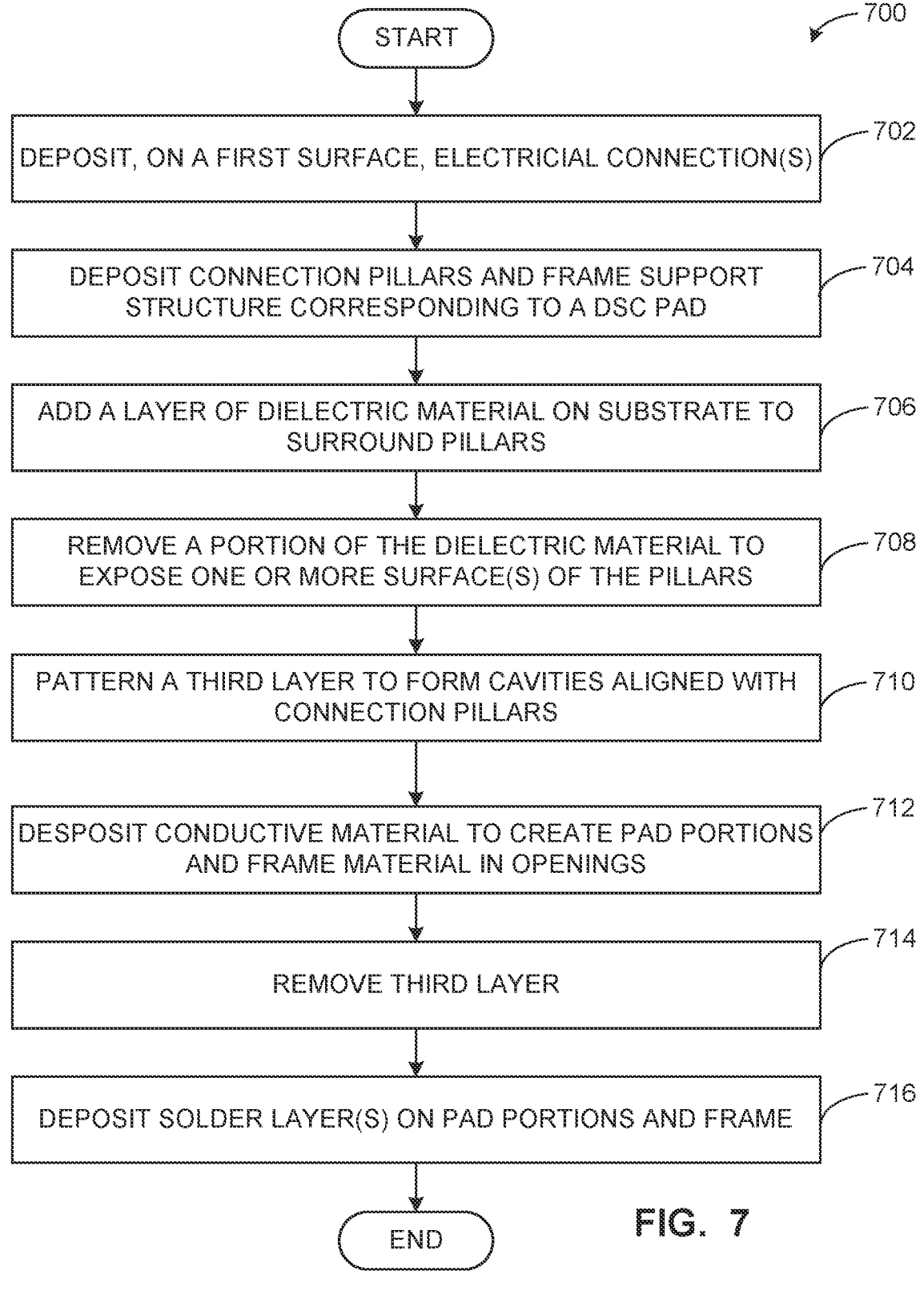

700

START

702 — DEPOSIT, ON A FIRST SURFACE, ELECTRICIAL CONNECTION(S)

704 — DEPOSIT CONNECTION PILLARS AND FRAME SUPPORT STRUCTURE CORRESPONDING TO A DSC PAD

706 — ADD A LAYER OF DIELECTRIC MATERIAL ON SUBSTRATE TO SURROUND PILLARS

708 — REMOVE A PORTION OF THE DIELECTRIC MATERIAL TO EXPOSE ONE OR MORE SURFACE(S) OF THE PILLARS

710 — PATTERN A THIRD LAYER TO FORM CAVITIES ALIGNED WITH CONNECTION PILLARS

712 — DESPOSIT CONDUCTIVE MATERIAL TO CREATE PAD PORTIONS AND FRAME MATERIAL IN OPENINGS

714 — REMOVE THIRD LAYER

716 — DEPOSIT SOLDER LAYER(S) ON PAD PORTIONS AND FRAME

END

FIG. 7

CAPACITOR PADS AND METHODS OF MANUFACTURING THE SAME

FIELD OF THE DISCLOSURE

This disclosure relates generally to integrated circuit packages and, more particularly, to capacitor pads and methods of manufacturing the same.

BACKGROUND

In many integrated circuit packages, one or more semi-conductor dies are mechanically and electrically coupled to an underlying package substrate. Frequently, the coupling of a die to an underlying substrate is achieved by aligning and connecting metal bumps fabricated on a surface of the die with corresponding pads and/or bumps on a facing surface of the package substrate. Such connections are often referred to as first level interconnects. As integrated circuits and their associated packages continue to decrease in size, the bumps and/or pads associated with these first level interconnects also need to decrease in size.

BRIEF DESCRIPTION OF THE DRAWINGS

FIG. 6A-6H illustrate various stages in the fabrication process of the example pad of FIG. 5A.

FIG. 7 is a flowchart illustrating an example method of manufacturing any one of the example pads of FIGS. 5A-5D.

Figure 1:
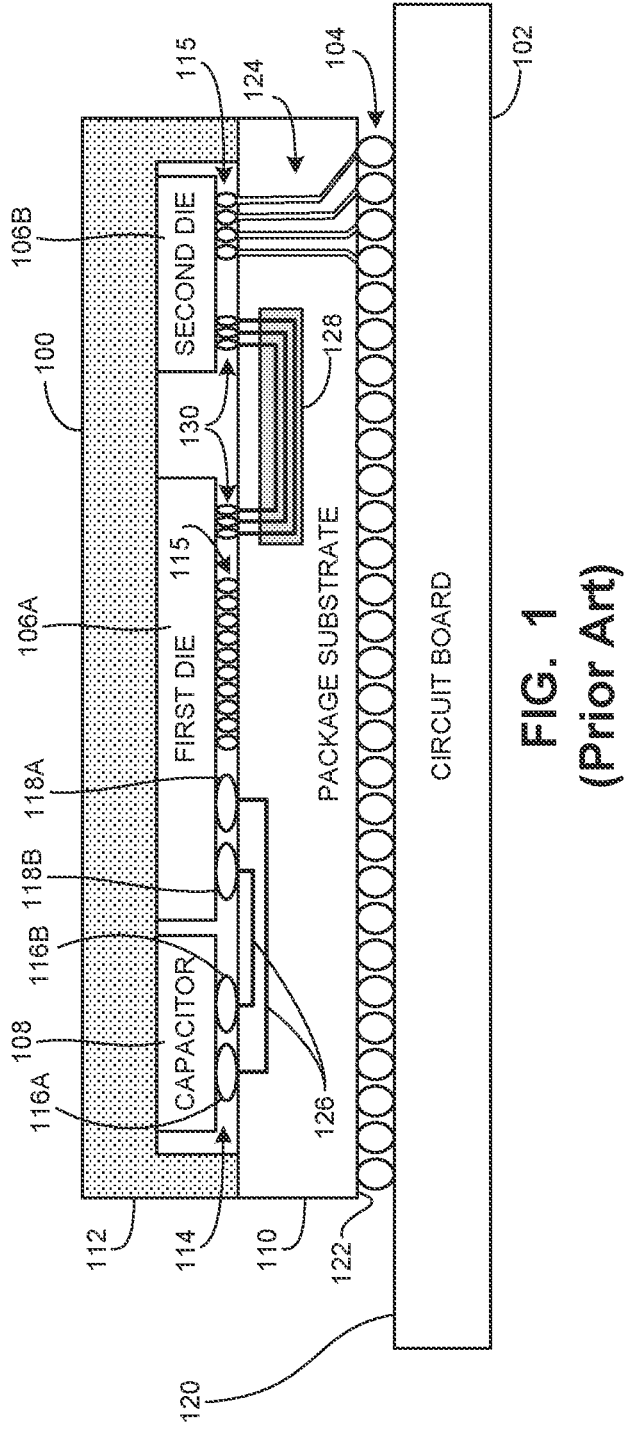
FIG. 1 illustrates an example integrated circuit (IC) package that includes an example die and an example capacitor that are electrically coupled to a package substrate that is electrically coupled to a circuit board.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

Some integrated circuit packages include interposers and/or embedded interconnect bridge (EMIB) disposed within a substrate (e.g., a package substrate) to enable separate dies on the substrate to be electrically coupled. For examples, these interposers and/or bridges include bumps and/or pads that bond with controlled collapse chip connections (C4) and/or flip chip connections (e.g., corresponding bumps and/or pads) on a mating surface of the dies. In some examples, these bumps and/or pads are composed of a copper (CU) layer, a nickel (Ni) layer, and a tin (Sn) layer. The tin layer protects the nickel layer and/or copper layer from oxidation and act as a solder volume when corresponding bumps and/or pads on the substrate and dies are connected during thermocompression bonding. For purposes of explanation, as used herein, the terms bumps and pads refer to the individual structures on mating surfaces of two components to be connected (e.g., a substrate and a die) prior to the structures being bonded together. Further, once corresponding ones of the bumps and/or pads joined to form an electrical connection between two components, the combined structure of the mating bumps and/or pads is referred to herein as an interconnect. That is, an interconnect includes two mated bumps, two mated pads, or a pad with a corresponding bump mated thereto.

Packaging space requirements often limit the size (e.g., horizontal dimension, etc.) and pitch requirements (e.g., lateral spacing, etc.) of the interconnects formed from the bumps and/or pads. Further, the relatively small sizes of interconnects creates a limitation on the thickness of the tin layer on the bumps and/or pads prior to their being bonded together. Particularly, smaller bump and/or pad sizes require thinner layers of tin to prevent the tin from flowing off the underlying copper/nickel layers and on to other components of the integrated circuit package during a reflow process. Typically, the tin is deposited on all bumps and/or pads during a single fabrication process such that the amount or thickness of the tin will be substantially consistent across all bumps and/or pads. However, not all bumps and associated pads are the same size. Thus, while some bumps and/or pads may be small and, therefore, are limited in the amount of tin they can hold, other bumps can be much larger but will nevertheless have the same thickness of tin applied to them as the smaller bumps and/or pads. Due to the material properties of tin and other solder material, there is a maximum surface area that a given volume of tin can cover when reflowed. As such, as the size of the smallest bumps and/or pads on a substrate decrease (with a corresponding decrease in the amount of tin deposited thereon), large bumps and/or pads may not have enough tin deposited thereon to be fully covered by the comparatively thin layer of tin after reflow.

For dies to be reliably connected, the bumps and/or pads on connecting surfaces of the dies and an underlying substrate must be fully covered by tin to prevent the other components of the bumps and/or pads (e.g., nickel and/or copper, etc.) from corroding. Bumps and associated pads for a die-side capacitor (e.g., a capacitor positioned to the side of a semiconductor die on a common substrate) are often significantly larger than the other bumps and pads of an integrated circuit package. Typically, the capacitor to be attached to a substrate will include bumps, whereas the substrate will include a corresponding pad to mate with the bump on the capacitor. Accordingly, for purposes of explanation, the interfacing portion of an interconnect on a substrate for a die-side capacitor will be referred to as a pad while the portion of the interconnect fabricated on the capacitor will be referred to as a bump. However, in some examples, the substrate may include a bump while the capacitor includes a mating pad. That is, as used herein, the terms bump and pad may be used interchangeably to generally refer to one side of an interconnect prior to it being joined to a second side of the interconnect. The bumps on the capacitor are typically the only bumps (or pads) on the capacitor. As such, the amount of tin added to such bumps is not constrained by other bumps when the capacitor is fabricated. However, the corresponding capacitor pads on the underlying substrate to which such a capacitor is to be attached can have other types of bumps and/or pads that are much smaller than the pads for the capacitor. As such, when tin is deposited on the die-side capacitor (DSC) pads (also referred to as capacitor pads herein for short), the tin thickness on these pads is limited by the maximum tin thickness permitted by bridge bumps and/or pads fabricated on the same substrate (e.g., associated with other smaller bumps, etc.). Accordingly, the maximum size of the capacitor pads is limited by the size of the other bumps and/or pads on the integrated circuit package.

Some integrated circuit packages include glass cores and/or other components, which offer superior mechanical properties when compared to prior generation materials. However, the use of glass cores prevents certain fabrication processes due to the material properties (e.g., brittleness, etc.) of the glass. For example, panel shock-sway agitation in wet chemistry baths and/or particular surface finishing methods typically used to fabricate recessed pads are unsuitable for substrates with glass cores. As such, glass cores cannot utilize recessed pads, which is a standard approach to fabricate DSC pads.

Examples disclosed herein overcome the above noted deficiencies by fracturing DSC pads into multiple smaller pad portions that are small enough to be completely covered by tin layers after reflow despite the amount of tin being limited in thicknesses by constraints driven by the other components of the substrate (e.g., smaller bumps and/or pads). In some examples, the separate portions of the fractured DSC pads can have any suitable shape (e.g., circular, rectangular, elongate, etc.) such that the tin layer is able to fully cover the pad portions during reflow. In some examples, the size of the individual pad portions can be equal to the smallest bump and/or pad includes on the substrate. In some examples disclosed herein, a frame is deposited around the DSC pad portions to prevent solder material (e.g., on the DSC pad or from the mating bump of the capacitor to be coupled to the DSC pad, etc.) from flowing onto the other components of the integrated circuit package surrounding the DSC pad.

FIG. 1 illustrates an example integrated circuit (IC) package 100 that is electrically coupled to a circuit board 102 via an array of bumps or balls 104 (e.g., a ball grid array). Additionally or alternatively, the package 100 may include pins (not illustrated) and/or pads (not illustrated), in addition to or instead of the balls 104, to enable the electrical coupling of the package 100 to the circuit board 102. In the illustrated example of FIG. 1, the package 100 includes an example first semiconductor die 106A, an example second semiconductor die 106B, and an example capacitor 108 that are mounted to an example package substrate 110 and enclosed by a package lid and/or an example mold compound 112. While the example package 100 of FIG. 1 includes two dies 106A, 106B and one capacitor 108, in other examples, the package 100 may have only one die or more than two dies and/or more than one capacitor 108. In some examples, the capacitor 108 can be a component of a voltage regulator.

In the illustrated example of FIG. 1, the dies 106A, 106B and the capacitor 108 are electrically and mechanically coupled to the package substrate 110 via corresponding arrays of example interconnects 114. In some examples, the electrical connections (1) between the dies 106A, 106b and the capacitor 108 and the package substrate 110 (e.g., the interconnects 114, etc.) and (2) between the IC package 100 and the circuit board 102 (e.g., the balls 104, etc.) are first level interconnects and second level interconnects, respectively. In some examples, one or more of the dies 106A, 106B and/or the capacitor 108 are stacked on top of one or more other dies. In some such examples, the dies 106A, 106B and/or the capacitor 108 are coupled to the underlying die through a first set of first level interconnects and the underlying die may be connected to the package substrate 110 via a separate set of first level interconnects associated with the underlying die. As used herein, the term "first level interconnects" refers to interconnects between a die (or capacitor) and a package substrate or a die (or capacitor) and an underlying die. Further, as used herein, an "interconnect" within the first level interconnects refers to a bump or pad on one of the dies 106A, 106B, the capacitor 108, or substrate 110 that has been bonded (e.g., via soldering) to a corresponding bump or pad on the mating one of the dies 106A, 106B, the capacitor 108, or the substrate 110.

In the illustrated example of FIG. 1, the interconnects 114 of the first level interconnects include example core interconnects 115, an example first capacitor interconnect 116A, an example second capacitor interconnect 116B, an example third capacitor interconnect 118A, an example fourth capacitor interconnect 118B, and example bridge interconnects 130. As used herein, the term "core interconnects" refers to interconnects created by the bonding of bumps on the dies 106A, 106B with corresponding bumps on the substrate 110 that enable electrical signals to pass between the dies 106A, 106B and components external to the IC package 100 (through the substrate 110). The bumps (or corresponding pads) that are associated with core interconnects are sometimes referred to herein as "core bumps" (or corresponding "core pads"). In the illustrated example of FIG. 1, the core interconnects 115 are physically connected to an example inner surface 120 of the package substrate 110 and are electrically coupled to the balls 104 on an example external surface 122 of the package substrate 110 via example traces 124 (e.g., internal interconnects, etc.) within the package substrate 110.

As used herein, the term "bridge interconnects" refer to interconnects created by the bonding of bumps on the dies 106A, 106B with corresponding bumps on the substrate 110 that enable electrical signals to pass between the first die 106A and the second die 106B via an example bridge 128 within the substrate 110. The bumps (or corresponding pads) that are associated with bridge interconnects are sometimes referred to herein as "bridge bumps" (or corresponding "bridge pads"). The example bridge 128 is an embedded interconnect bridge (EMIB), which facilitates communication between the dies 106A, 106B.

As used herein, the term "capacitor interconnects" refer to interconnects created by the bonding of bumps on the first die 106A and the capacitor 108 with corresponding bumps on the substrate 110 that enable electrical signals to pass between the first die 106A and the capacitor 108 via the substrate 110. The bumps (or corresponding pads) that are associated with capacitor interconnects are sometimes referred to herein as "capacitor bumps" (or corresponding "capacitor pads"). In the illustrated example of FIG. 1, the capacitor interconnects 116A, 116B are associated with the capacitor 108 and the capacitor interconnects 118A, 118B are associated with the die 106. In the illustrated example of FIG. 1, the capacitor interconnects 116A, 116B of the capacitor 108 are electrically coupled to the capacitor interconnects 118A, 118B of the first die 106A via example traces 126 within the package substrate 110. In the illustrated example of FIG. 1, the capacitor interconnects 116A, 116B, 118A, 118B are significantly larger than the core interconnects 115. Further, as shown in the illustrated example of FIG. 1, the core interconnects 115 are larger than the bridge interconnects 130. Thus, in this example, the bridge interconnects 130 are the smallest type of interconnect extending between the substrate 110 and the dies 106A, 106B, and the capacitor 108.

The interconnects 114 associated with the first level interconnects are fabricated through a series of different processes that can lead to potential defects when an IC package such as the package 100 of FIG. 1 is assembled. In particular, the interconnects 114 are initially formed as separate components (e.g., bumps and/or pads) on respective surfaces of the die 106, the capacitor 108, and the substrate 110 through a lithographic process by which a dry film resist is applied to the surface where the interconnects 114 are to be located. The dry film resist is patterned with openings corresponding to the locations of the individual interconnects and then a plating process is performed to fill the openings with metal that is to serve as the bumps and/or pads that are to be bonded together to form the interconnects 114.

Often, the metal used for the plating of the bumps and/or pads includes a layer of copper that is in electrical contact with metal interconnects within the substrate onto which the bumps and/or pads are being formed. Thereafter, a nickel barrier layer is added onto the copper and then a layer of tin is added onto the nickel. After the plating of the metal layers, the tin undergoes a reflow process in which heat is applied to melt the tin. However, the other components of the bumps and/or pads (e.g., nickel, copper, etc.) do not melt because they have substantially higher melting points. When the tin melts, the surface tension of the tin causes the tin to draw together into a domed shape on top of the nickel and copper layers. After the reflow process the tin again hardens but retains the round shape developed while melted. Thereafter, the bumps and/or pads on the substrate are bonded with corresponding bumps and/or pads on the dies 106A, 106B or the capacitor 108 during a thermocompression bonding process. Examples of this process are described below in conjunction with FIGS. 6A-7.

The deposition of the tin for the bumps and/or pads (including bridge bumps/pads, core bumps/pads, and capacitor bumps/pads) typically occurs during a single stage of a fabrication process of package 100. As such, the thickness of the applied tin is typically the same on each of the bumps and/or pads. To prevent tin from flowing off of the underlying copper and/or nickel layers of the bumps and/or pads when it melts during the reflow process, the thickness of the deposited tin is typically based on the smallest bumps and/or pads on the substrate (e.g., the bridge bumps associated with the bridge interconnects 130 in the illustrated example). That is, if the thickness of the deposited tin is too large, the tin may overflow the top of the bridge bumps and flow onto other components of the package 100. However, due to this size restriction, the substantially greater size of the capacitor pads associated with the capacitor interconnects 116A, 116B, 118A, 118B can make the thickness of the tin deposited thereon insufficient to cover the entire surface area of the pads of the capacitor interconnects 116A, 116B, 118A, 118B. In particular, as mentioned above, when the tin melts, its surface tension draws the tin together into a rounded and/or domed shape. If the amount of tin on the nickel and copper layers is small relative to the surface area of the interface between the tin and the underlying copper and nickel, the surface tension of the tin (in combination with the wetting property of tin on nickel) can draw the tin together in a manner that results in a portion of the copper and/or nickel being exposed or becoming uncovered. Examples where the thickness of tin is sufficient to cover the pitch of the bump and insufficient to cover the pitch of the bump are described below in conjunction with FIGS. 3A and 3B.

Figure 2A:
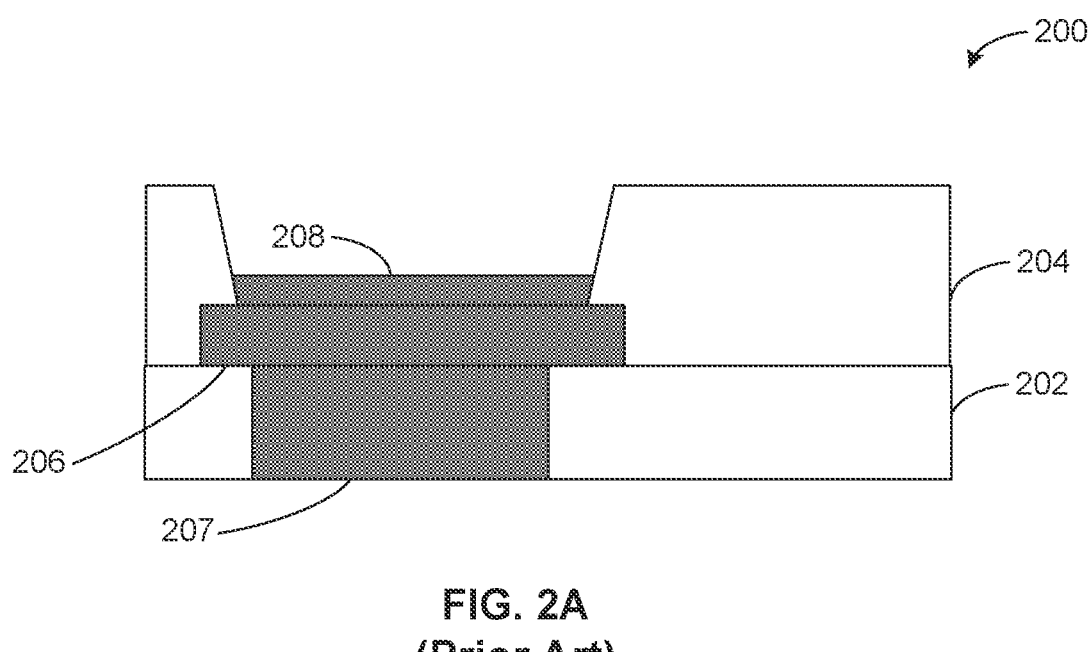
FIG. 2A illustrates a prior-art recessed pad.
Figure 2B:
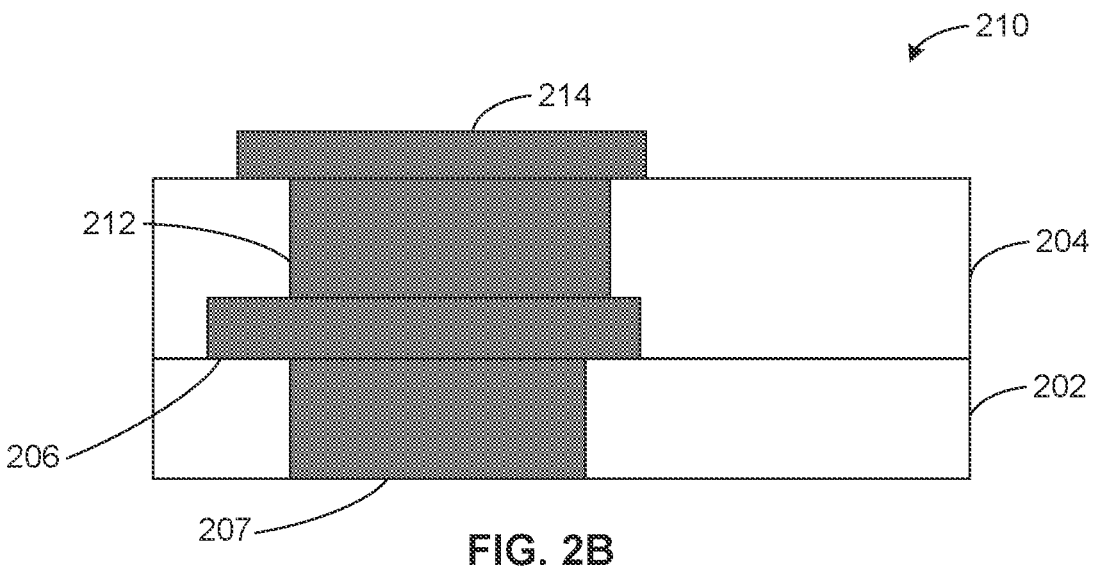
FIG. 2B illustrates an example pad in which teachings of this disclosure may be implemented.

FIGS. 2A and 2B illustrate die-side capacitor pads on a substrate (e.g., the substrate 110) that can be used to electrical couple a die (e.g., the die 106) or a capacitor (e.g., the capacitor 108) with the substrate by bonding with corresponding bumps (e.g., the capacitor interconnects 116A, 116B, 118A, 118B). FIG. 2A illustrates a prior art capacitor pad region 200 that includes a first dielectric layer 202 (e.g., a build-up (BU) layer, a core of the substrate, etc.), a second dielectric layer 204 (e.g., a passivation layer), a first metal connection 206, and a second metal connection 207, and a recessed pad 208. In the illustrated example of FIG. 2A, the recessed pad 208 can receive and bond with a corresponding bump on a die (e.g., the dies 106A, 106B of FIG. 1, etc.) or capacitor (e.g., the capacitor 108 of FIG. 1, etc.), thereby allowing electrical communication between the coupled die or capacitor and the substrate via the electrical connections 206, 207. In the illustrated example of FIGS. 2A and 2B, the layers 202, 204 are coupled of an organic and/or non-organic dielectric material (e.g., epoxy, resin, etc.). In other examples, the layers 202, 204 can be composed of any other suitable material(s).

FIG. 2B illustrates an example pad region 210 on a substrate (e.g., the substrate 110 of FIG. 1) that includes the first layer 202 of FIG. 2A, the second layer 204 of FIG. 2A, and the metal connections 206, 207 of FIG. 2A. In the illustrated example of FIG. 2B, the pad region 210 includes an example conductive (e.g., metal) pillar 212 and an example protruded pad 214. The protruded pad 214 has the same functionality of the recessed bump pad region 208 of FIG. 2A. That is, the pad 214 is to interface and bond with a corresponding bump on a die or capacitor. The pads 208, 214 can include layers of copper, nickel and/or tin (not yet applied in the illustrated examples of FIGS. 2A and 2B). In other examples, the pads 208, 214 can be composed of any other suitable materials. Unlike the pad region 200 of FIG. 2A, the pad region 210 can be used with a glass substrate. Particularly, in some examples, the recessed pad 208 of FIG. 2A is manufactured using relatively high stress manufacturing processes (e.g., panel shock-sway agitation, wet chemistry baths, etc.), that may damage glass substrates when used.

In the illustrated example of FIG. 2B, when the pad 214 is bonded to a capacitor within an IC package that is put into operations, electrical current may be transferred from between the capacitor and the substrate through the protruded pad 214, the example pillar 212, and the electrical connections 206, 207. In the illustrated example of FIG. 2B, the pillar 212 extends through the second layer 204. In the illustrated example of FIG. 2B, the pillar 212 is composed of a metal (e.g., the same metal as the electrical connections 206, 207). In other examples, the pillar 212 can be composed of any other suitable conductive material.

Figure 3A:
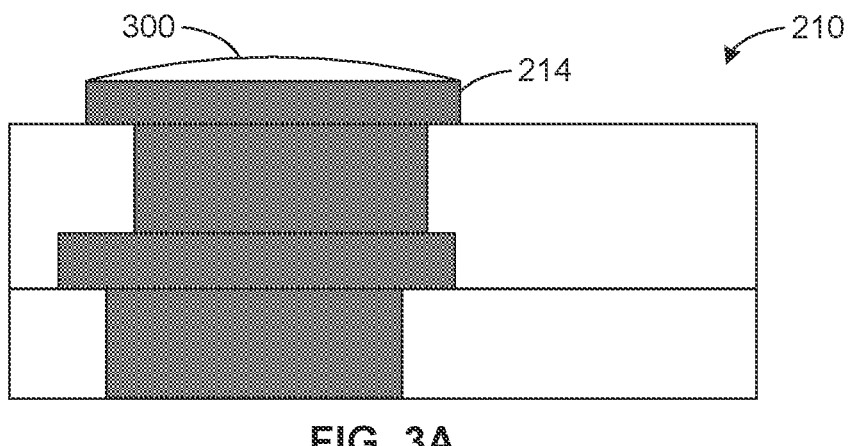
FIG. 3A illustrates the example pad of FIG. 2B with a sufficient tin layer.

FIG. 3A illustrates the example pad region 210 of FIG. 2B with an example sufficient tin layer 300. In the illustrated example of FIG. 2A, a tin layer 300 has been deposited on the pad 214 and reflowed. Prior to reflow process, the tin layer 300 is deposited in even layers (e.g., substantially parallel to the surface of the underlying pad 214, etc.). As the tin layer 300 is heated during the reflow process, the tin becomes a liquid and assumes a spherical cap shape (as illustrated in FIG. 3A) due to the surface tension of the liquid tin. When the tin layer 300 cools and solidifies, the tin layer 300 maintains the spherical cap shape illustrated in FIG. 3A.

In the illustrated example of FIG. 3A, the tin layer 300 covers the entirety of the surface area of the pad 214. In some examples, to reliably connect the capacitor 108 and the package substrate 110 in a manner that reduces (e.g., avoids) corrosion from occurring, the pad 214 must be substantially completely covered with tin. As used herein, the term "substantially completely" refers to one surface and/or substance covering at least 99% of another surface or substance. In the illustrated example of FIG. 3A, the pad 214 is substantially completely covered by tin layer 300, thereby enabling reliable connection between the capacitor and substrate coupled via the bump pad region 210.

Figure 3B:
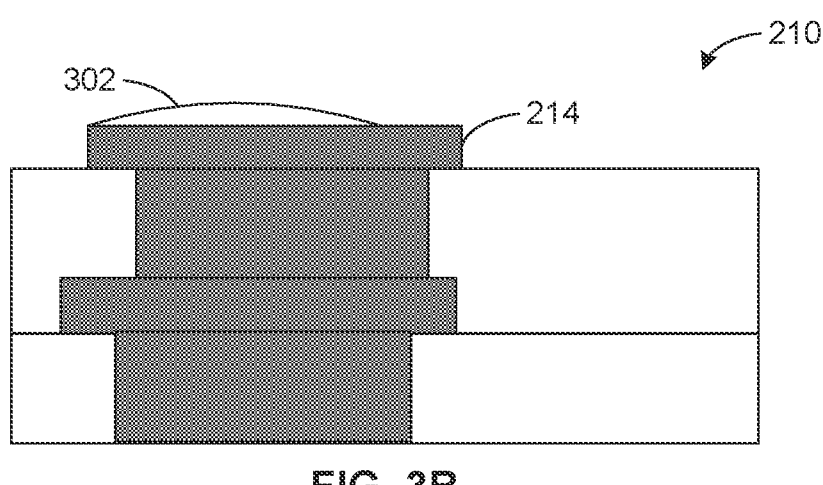
FIG. 3B illustrates the pad of FIG. 2B with an insufficient tin layer.

FIG. 3B illustrates the pad region 210 of FIG. 2B with an example insufficient tin layer 302. In the illustrated example of FIG. 3B, the insufficient tin layer 302 does not substantially completely cover the pad 214. Due to the material properties of tin (e.g., surface tension, wetting properties, etc.), there is a maximum surface area that a given volume of tin will be able to cover during reflow. For example, empirical evidence suggests 15 micrometers of tin (as initially plated onto a pad surface before reflow) is not enough to completely cover a pad diameter of greater than 500 micrometers (after reflow). Thus, as the bumps continue to shrink in size (with the bridge bumps being the smallest) while capacitor pads remain at a relatively larger size, the probability of insufficient tin coverage like that illustrated in FIG. 3B will increase. In the illustrated example of FIG. 3B, the insufficient tin layer 302 can cause the exposed portions of the pad 214 to corrode and prevent reliable communication between the capacitor and the substrate coupled via the pad 214.

Figure 4:
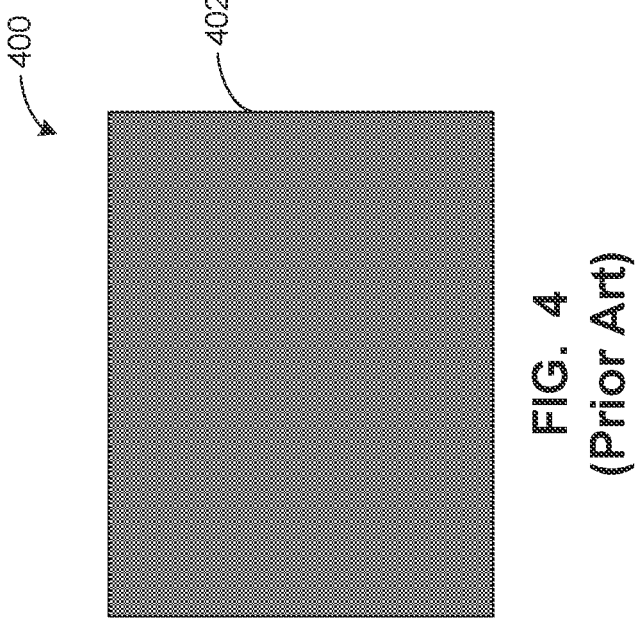
FIG. 4 illustrates a top view of a prior-art pad.

FIG. 4 illustrates a top view of a prior-art capacitor pad 400 that may be used on a package substrate (e.g., the substrate 110) to connect with a capacitor (e.g., the capacitor 108) through the capacitor interconnects 116A, 116B, 118A, 118B. In the illustrated example, the pad surface 402 of the capacitor pad 400 is substantially rectangular in shape. In the illustrated example of FIG. 4, the entirety of the pad surface 402 is connected to a single electrical connection of the package substrate 110 associated with a single terminal of the capacitor 108. While the capacitor interconnects 116A, 116B, 118A, 118B are described herein as typically rectangular in shape, in other examples, the capacitor interconnects 116A, 116B, 118A, 118B can have any other suitable shape.

The following examples refer to capacitor pads that are similar to those described above, except that the pads include features that enable the surface area of the pads to be substantially completely covered with tin despite the plating height of the tin being smaller due to decreased dimensions of associated bridge bumps on the same substrate. When the same element number is used in connection with FIGS. 5A-D, 6A-G, and 7 as was used in FIGS. 1-4, it has the same meaning unless indicated otherwise.

Figures 5A, 5B, 5C, 5D:
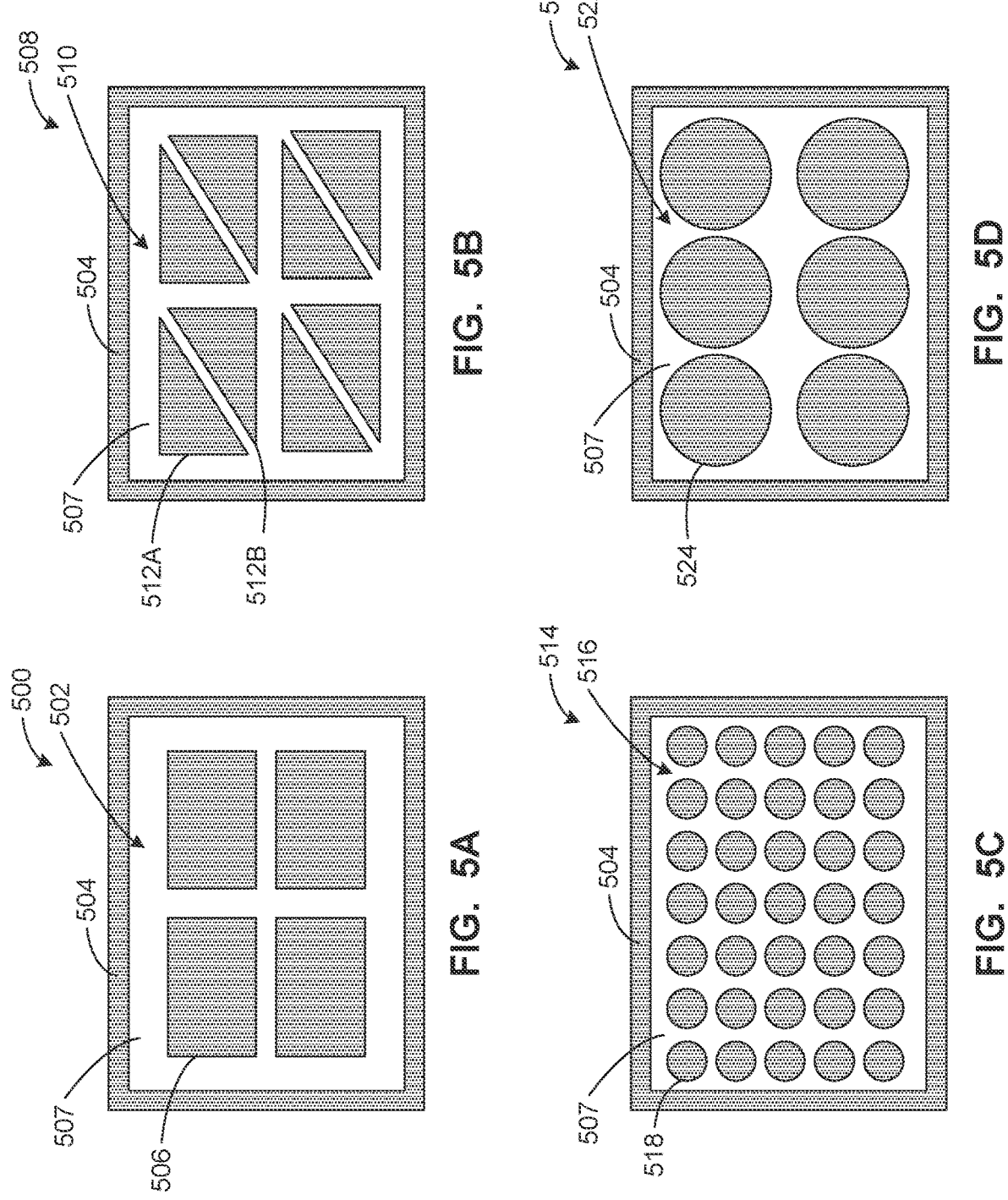
FIGS. 5A-5D illustrate various top views of example pads configured in accordance with teachings of this disclosure.

FIG. 5A illustrates a top view of an example first bump pad region 500 with an example set of pad portions 502 configured in accordance with teachings of this disclosure. In the illustrated example of FIG. 5A, the example first bump pad region 500 includes an example frame 504 that surrounds the set of pad portions 502. In the illustrated example of FIG. 5A, the first plurality of pad portions 502 includes an example first pad portion 506. In the illustrated example of FIG. 5A, the first bump pad region 500 includes a portion of an example first dielectric layer 507 which is not covered by the plurality of pad portions 502. That is, the separate pad portions 502 are laterally separated or isolated by exposed regions of the dielectric layer 507. In some examples, the dielectric layer 507 corresponds to the inner surface 120 of the substrate 110 of FIG. 1, which corresponds to the second layer 204 of FIGS. 2A-B. In the illustrated example of FIG. 5A, the first bump pad region 500, like the bump pad region 400 of FIG. 4, is coupled a single electrical connection of the package substrate 110 and a single electrical connect of the interfacing capacitor 108. That is, although isolated and distinct from one another, in this example, the separate pad portions 502 collectively correspond to a single capacitor pad that connects with a single terminal of a capacitor. Thus, when connected to a capacitor 108, each of the pad portions 502 will be electrical coupled to the same single terminal of the capacitor 108 such that each of the pad portions 502 transmit electrical current to a single electrical connection of the package substrate 110 and a single terminal of the capacitor 108. In some examples, each of the pad portions 502 includes a corresponding pillar (e.g., similar to the pillar 212 of FIG. 2B, etc.) that is separated from other pillars associated with other ones of the pad portions 502 by the dielectric material in the dielectric layer 507. In other examples, some or all of the pad portions 500 can share one or more pillars.

In the illustrated example of FIG. 5A, the first pad portion 506 and the other pad portions 502 are rectangular prisms and have the same size and same shape. In other examples, the first pad portion 506 and the other pad portions 502 can have different shapes (e.g., rectangular prisms, cylinders, triangular prisms, etc.) and/or different sizes (e.g., different lateral dimensions, different heights, etc.). In the illustrated example of FIG. 5A, the size of the first pad portion 506 and the other pad portions 502 are less than or equal to the maximum size (e.g., maximum area) coverable by the thickness of tin disposed on the pad portions 502 (e.g., limited by the thickness of tin disposed on the bridge bumps, etc.).

FIG. 5B illustrates a top view of example second bump pad region 508 with an example second set of pad portions 510 configured in accordance with teachings of this disclosure. The example bump pad region 508 of FIG. 5B similarly includes the frame 504 of FIG. 5A and the example layer 507 of FIG. 5A. In the illustrated example of FIG. 5B, the second plurality of pad portions 508 includes an example second pad portion 512A and an example third pad portion 512B. In the illustrated example of FIG. 5B, the second bump pad region 508, like the bump pad region 400 of FIG. 4 and the first bump pad region 500 of FIG. 5A, is coupled to a single electrical connection of the package substrate 110, which is associated with a single terminal of the capacitor 108. That is, each of the second pad portions 510 transmit an electrical current to between a single electrical connection of the package substrate 110 and a single terminal of the capacitor 108. In some examples, each of the second pad portions 508 includes a corresponding pillar (e.g., similar to the pillar 212 of FIG. 2B, etc.). In other examples, some or all of the pad portions 510 can share one or more pillars. For example, the first pad portion 512A and the second pad portion 512B and/or other pairs of corresponding ones of the second plurality of pads 510 can share a pillar.

In the illustrated example of FIG. 5B, the pad portions 512A, 512B and the other pad portions 510 are triangular prisms and have the same size and same shape. In other examples, the pad portions 512A, 512B and the other pad portions 510 can have different shapes (e.g., rectangular prisms, cylinders, triangular prisms, etc.) and/or different sizes (e.g., different lateral dimensions, different heights, etc.). In the illustrated example of FIG. 5B, the pad portions 512A, 512B have different orientations (e.g., the orientation of the hypotenuse of the pad portions 510, etc.). Notably, the total combined area of all eight pad portions 510 of FIG. 5B is substantially the same as the total combined area of all four pad portions 502 in FIG. 5A. However, the area of each individual pad portion 510 in FIG. 5B is approximately half the area of each individual pad portion 502 of FIG. 5A. As a result, the amount of thickness of plated tin that needs to be included on the pad portions 510 in FIG. 5B to ensure full coverage after reflow can be less than the thickness of plated tin that needs to be included on the pad portions 502 in FIG. 5A.

FIG. 5C illustrates a top view of example third pad region 514 with an example third set of pad portions 516 configured in accordance with the teachings of this disclosure. The example pad portion 516 of FIG. 5C similarly includes the frame 504 of FIGS. 5A-5B and the example layer 507 of FIG. 5A-5B. In the illustrated example of FIG. 5C, the third plurality of pad portions 516 includes an example fourth pad portion 518. In the illustrated example of FIG. 5B, the second pad region 508, like the pad region 400 of FIG. 4, the first pad region 500 of FIG. 5A, and the second pad region 508 of FIG. 5B is coupled to a single electrical connection of the package substrate 110, which is associated with a single terminal of the capacitor 108. That is, each of the third pad portions 516 transmit electrically current to a single electrical connection of the package substrate 110 and a single terminal of the capacitor 108. In some examples, each of the third pad portions 516 includes a corresponding pillar (e.g., similar to the pillar 212 of FIG. 2B, etc.). In other examples, some or all of the pad portions 516 can share one or more pillars.

In the illustrated example of FIG. 5C, the pad portions 516 are cylindrical and have the same size and same shape. In other examples, the pad portion 518 and the other pad portions 516 can have different sizes (e.g., rectangular prisms, cylindrical, triangular prisms, etc.) and/or different shapes (e.g., different pitch dimensions, different heights, etc.). In the illustrated example of FIG. 5B, the pad portions 512A and 512B have different orientations (e.g., the orientation of the hypotenuse of the pads 510, etc.). In the illustrated example of FIG. 5C, each of the pad portions 516 corresponds to the size of the bridge bumps associated with corresponding bridge interconnects 130 on the package substrate 110.

FIG. 5D illustrates a top view of example fourth pad region 520 with an example fourth set of pad portions 522 configured in accordance with the teachings of this disclosure. The example pad region 520 of FIG. 5C similarly includes the frame 504 of FIGS. 5A-5C and the example layer 507 of FIG. 5A-5C. In the illustrated example of FIG. 5D, the fourth plurality of pad portions 522 includes an example fourth pad portion 524. In the illustrated example of FIG. 5D, the fourth pad region 520, like the pad region 400 of FIG. 4, the first pad region 500 of FIG. 5A, the second pad region 508 of FIG. 5B, and the third pad 514 of FIG. 5C, is coupled a single electrical connection of the package substrate 110. That is, each of the fourth pad portions 522 transmit electrically current to a single electrical connection of the package substrate 110 and a single terminal of the capacitor 108. In some examples, each of the fourth pad portions 522 includes a corresponding pillar (e.g., similar to the pillar 212 of FIG. 2B, etc.). In other examples, some or all of the pad portions 522 can share one or more pillars.

In the illustrated example of FIG. 5D, the pad portions 522 are cylindrical and have the same size and same shape. In other examples, the pad portion 518 and the other pad portions 522 can have different sizes (e.g., rectangular prisms, cylindrical, triangular prisms, etc.) and/or different shapes (e.g., different pitch dimensions, different heights, etc.). In the illustrated example of FIG. 5B, the pad portions 522 have different orientations. Like the pad portions 502 of FIG. 5A, the size of the first pad portion 524 and the other pad portions 522 correspond to the maximum size coverable by the thickness of tin disposed on the pad portions 522 (e.g., limited by the thickness of tin disposed on the bridge bumps associated with bridge interconnects 130, etc.), but are cylindrical in shape.

The frame 504 of FIGS. 5A-5D prevents solder material from leaving the boundaries of the pad regions 500, 508, 514, 520 during assembly of the package 100. For example, during the coupling of the capacitor 108 and/or the dies 106A, 106B to the package substrate 110, solder material (e.g., tin) included on the bumps of the capacitor 108 and/or the dies 106A, 106B (e.g., the bumps to be bonded to the pad regions 500, 508, 514, 520, etc.) and/or the solder material on the individual pad portions 502, 510, 516, 522, can become liquid and spread or flow across the surface of the substrate 110 (across the dielectric layer 507). In some such examples, this solder material could overflow into the other components of the die 106, capacitor 108, and/or the package substrate 110 if not retained by the frame 504. In some examples, the frame 504 can be absent. In such examples, the amount of solder material can be controlled to reduce (e.g., minimize, etc.) the likelihood of overflow onto other components of the die 106, capacitor 108, and/or the package substrate 110. In the illustrated examples of FIG. 5A-5D, the frame 504 is a conductive element that is connected to the single electrical connection of the package substrate 110 to which the plurality of pad portions 502, 510, 516, 522 are also connected. As such, the frame 504 can also transmit electrical current between the die 106, the capacitor 108, and/or the package substrate 110. In other examples, the frame 504 can be composed of a non-conductive material (e.g., an epoxy, an organic material, etc.) and/or not coupled to the electrical connection of the plurality of pad portions 502, 510, 516, 522. In such examples, the frame 504 does not conduct electrical current between the die 106, the capacitor 108, and/or the package substrate 110. Although the frame 504 in the illustrated examples is rectangular in shape, in other examples, the frame 504 can have any other suitable shape.

The illustrated examples of FIGS. 5A-5D include a variety of shapes, sizes and orientations for the pad portions 502, 510, 516, 522 of the pad regions 500, 508, 514, 520, respectively. Teachings of this disclosure are not limited to these shapes, sizes and orientations but include any suitable shapes, sizes or orientations of the pad portions.

Figures 6D, 6E, 6F:
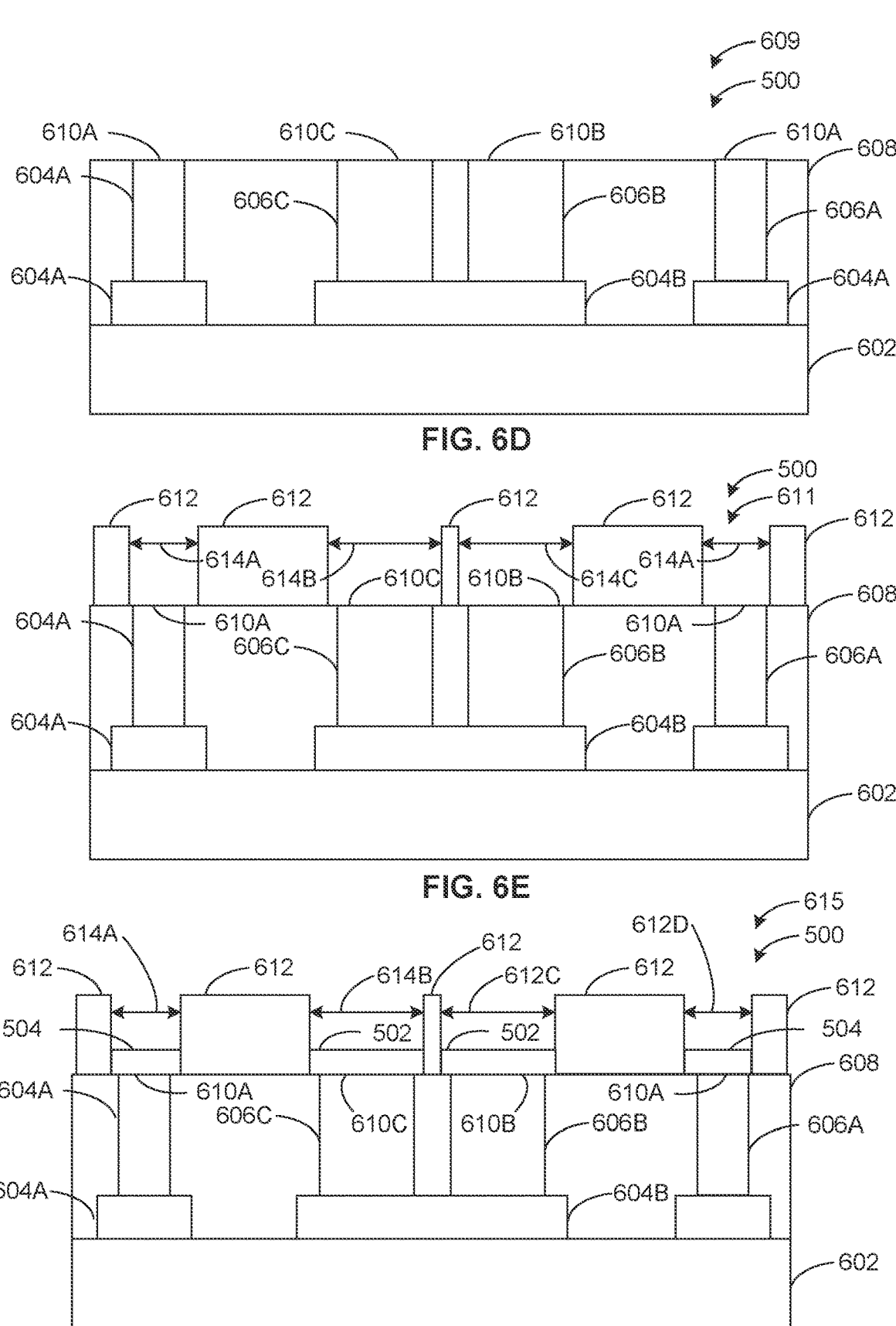

FIG. 6A-6G illustrate various stages in an example fabrication process of the bump pad region 500 of FIG. 5A. FIG. 6A illustrates an example first stage 600 of the fabrication process. In the illustrated example of FIG. 6A, a first electrical connection 604A and a second electrical connection 604B have been disposed on an example first layer 602. In the illustrated example of FIG. 6A, the first layer 602 can be composed of an epoxy and/or any other suitable non-conductive (dielectric) material. In some examples, the first layer 602 corresponding to the first layer 202 of FIGS. 2A-B. In the illustrated example of FIG. 6A, the electrical connections 604A, 604B are distinct segments. In other examples, a single electrical connection can instead by disposed on the first layer 602 (e.g., the electrical connections 604A, 604B can be unitary, etc.). In some examples, the first layer 602 can include additional connections (not illustrated), traces (not illustrated), or vias (not illustrated) which can further electrical connection(s) (e.g., the connection 207 of FIGS. 2A and 2B, etc.) the components of the first pad region 500 with out components of an integrated circuit package.

FIG. 6B illustrates an example second stage 603 of the fabrication process. In the illustrated example of FIG. 6B, an example frame support structure 606A has been disposed on the example first electrical connection 604A, an example first pillar 606B has been disposed on the second electrical connection 604B, an example second pillar 606C has been disposed on the second electrical connection 604B. In some examples, the frame support structure 606A and the pillars 606B, 606C are composed of a conductive material (e.g., copper, nickel, etc.). In other examples, the frame support structure 606A and the pillars 606B, 606C be composed on any suitable material. In some examples, the frame support structure 606A and the pillars 606B, 606C can be deposited on the electrical connections by lithography. In other examples, the frame support structure 606A and the pillars 606B, 606C can be deposited by any other suitable means.

FIG. 6C illustrates an example third stage 605 of the fabrication process. In the illustrated example of FIG. 6C, an example second layer 608 has been deposited. In the illustrated example of FIG. 6C, the second layer 608 is composed of non-conductive material (e.g., an epoxy or other dielectric, etc.). In other examples, the second layer 608 can be composed on any suitable material. In some examples, the second layer 608 corresponds to the second layer 204 of FIGS. 2A-B. In some examples, the second layer 608 can be deposited via lamination. In other examples, the second layer 608 can be deposited by any other suitable means. In some examples, the frame support structure 606A and the pillars 606B, 606C can be absent. In such examples, after the deposition of the second layer 608, the second layer 608 can modify to include vias and/or traces to transmit electric signals. In some such examples, these vias and/or traces can be formed via any suitable process (e.g., laser drilling, photolithography, etc.).

FIG. 6D illustrates an example fourth stage 609 of the fabrication process. In the illustrated example of FIG. 6D, a portion of the second layer 608 has been removed to expose an example first surface 610A of the frame support structure 606A, an example second surface 610B of the first pillar 606B, and an example third surface 610C of the second pillar 606C. For example, the portion of the second layer can be removed via a planarization process. In other examples, the portion of the layers can be removed by any other suitable means.

FIG. 6E illustrates an example fifth stage 611 of the fabrication process. In the illustrated example of FIG. 6E, an example third layer 612 has been deposited and subsequently processed to form an example first cavity 614A over the first surface 610A, an example second cavity 614B over the second surface 610A, and an example third cavity 614C over the third surface 610C. For example, the third layer 612 can be by depositing a dry film resist (DFR) and then using lithography methods to pattern openings in the DFR corresponding to the cavities 614A, 614B, 614C. In other examples, the third layer 612 and/or cavities 614A, 614B, 614C can be formed by any other suitable means.

FIG. 6F illustrates an example sixth stage 617 of the fabrication process. In the illustrated example of FIG. 6F, the example frame 504 has been deposited in the first cavity 614A, and two of the example pad portions 502 have been deposited in the example cavities 614B, 614C. As described above, the pad portions 502 can be formed of copper and nickel with a layer of tin deposited thereon to protect the copper and nickel from corrosion and to serve as a solder material when the pad portions 502 are to be bonded with a correspond bump on a capacitor 108 or die 106. In some examples, the frame 504 and/or the pad portions 502 can be formed via an electrolytic plating process.

Figures 6G, 6H:
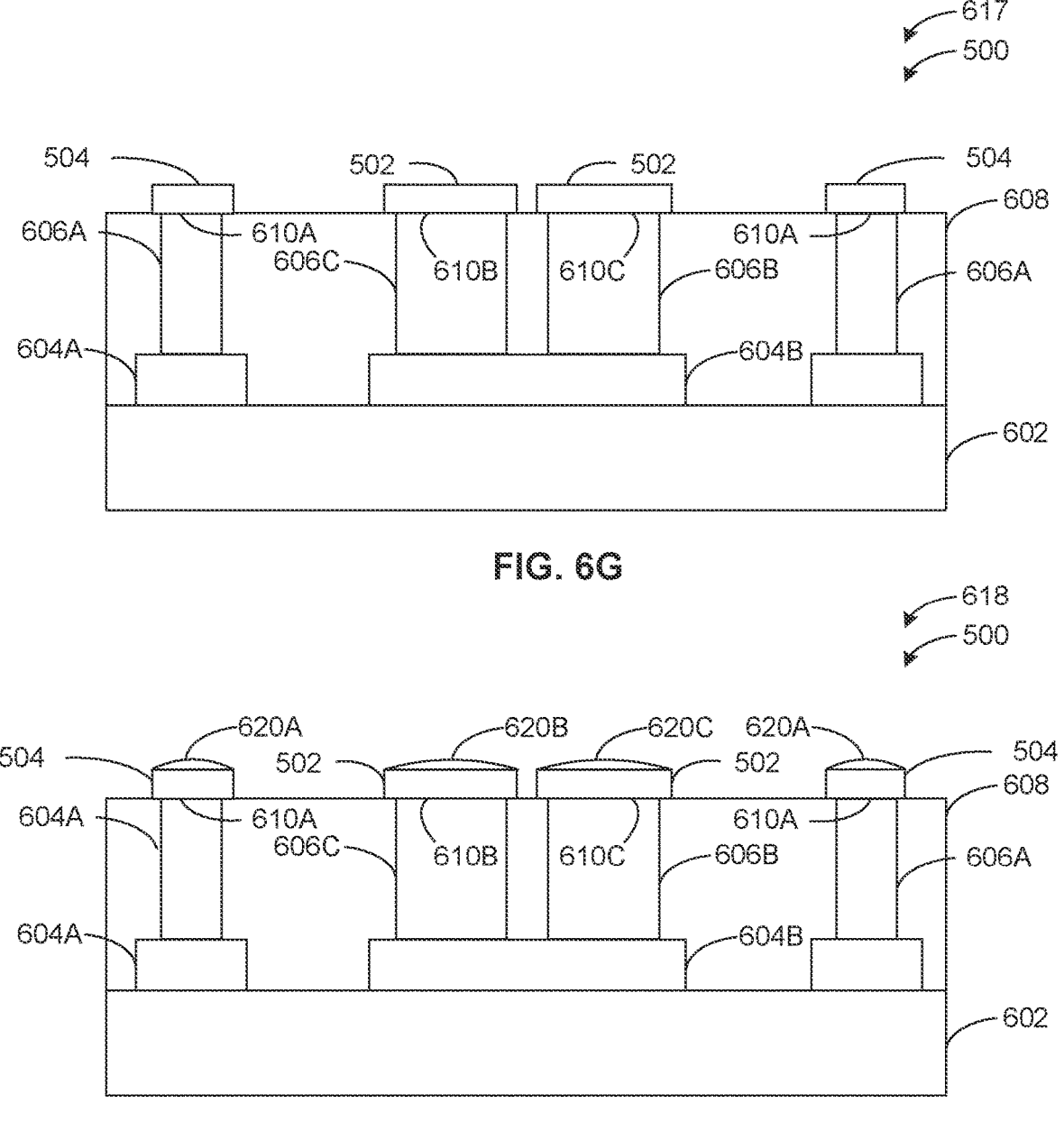

FIG. 6G illustrates an example seventh stage 617 of the fabrication process. In the illustrated example of FIG. 6G, the third layer 612 has been removed. For example, if the third layer is a DFR layer, the third layer 612 can removed by a DFR strip process. In other examples, the third layer 612 can be removed by any other suitable means. FIG. 6H illustrates an example eighth stage 618 of the fabrication process. In the illustrated example of FIG. 6H, an example first solder layer 620A has been deposited on the frame 504. In the illustrated example of FIG. 6H, an example second solder layer 620B and an example third solder layer 620C has been deposited on the pad portions 502. In the illustrated example of FIG. 6H, the solder layers 620A, 620B, 620C have been reflowed such that form a rounded/domed shaped. In the illustrated example of FIG. 6H, the solder layers 620A, 620B, 620C substantially completely cover the corresponding ones of the pad portions 502 and the frame 504. In some examples, solder material would not be able to substantially completely cover prior art pads, like the one illustrated in FIG. 4.

FIG. 7 is a flowchart illustrating an example process 700 of manufacturing the package substrate bump pad region 500 of FIGS. 5A and 6A-6G. Although the example method of manufacture is described with reference to the flowchart illustrated in FIG. 7, many other methods may alternatively be used. For example, the order of execution of the blocks may be changed, and/or some of the blocks described may be combined, divided, re-arranged, omitted, eliminated, and/or implemented in any other way.

The example process 700 begins at block 702 by depositing electrical connections 604A, 604B on the first layer 602. In other examples, the electrical connections depositing on the first layer 602 can be depositing as a single feature (e.g., a single electrical connection corresponding to the frame and the pillars, etc.). The point of fabrication after completion of block 702 corresponds to the pad region 500 as shown in FIG. 6A. At block 704, the example process includes depositing the frame support structure 606A and the pillars 606B, 606C corresponding to a die-side capacitor pad. For example, the frame support structure 606A and the pillars 606B, 606C can be deposited via photolithography. In other examples, a single pillar can be deposited onto the electrical connection(s) deposited during the execution of block 702. The point of fabrication after completion of block 704 corresponds to the pad region 500 as shown in FIG. 6B.

At block 706, the example process 700 includes adding a layer of dielectric material (e.g., the second layer 608) to surround the deposited the frame support structure 606A and the pillars 606B, 606C. In some examples, the second layer 608 can be deposited via lamination. In other examples, the second layer 608 can be deposited via any other suitable means. The point of fabrication after completion of block 706 corresponds to the bump pad region 500 as shown in FIG. 6C. At block 708, the example process 700 includes removing a portion of the second layer 608 to expose one or more of the surfaces 610A, 610B, 610C of the frame support structure 606A and the pillars 606B, 606C. The point of fabrication after completion of block 708 corresponds to the pad region 500 as shown in FIG. 6D.

At block 710, the example process 700 includes depositing and patterning the third layer 612 to form cavities 614A, 614B, 614C aligned with the frame support structure 606A and the pillars 606B, 606C. For example, the third layer 612 and/or the surfaces 610A, 610B, 610C can be formed lithographically patterning a deposited dry film resist (DFR). The point of fabrication after completion of block 710 corresponds to the pad 500 as shown in FIG. 6E. At block 712, the example process 700 includes depositing conductive material in the cavities 614A, 614B, 614C to create the pad portions 502 and the frame 504. In some examples, the conductive materials include a layer of copper, followed by a layer of nickel, followed by a layer of tin. In some examples, each of layers of metal are deposited via electrolytic deposition. The point of fabrication after completion of block 710 corresponds to pad region 500 as shown in FIG. 6F.

At block 714, the example process 700 includes removing the third layer 612. For example, if the third layer 612 is a dry film resist, the third layer 612 can be removed via dry film resist stripping. In other examples, the third layer 612 can removed by any other suitable means. The point of fabrication after completion of block 714 corresponds to the pad region 500 as shown in FIG. 6G.

At block 716, the example process 700 include depositing the solder layers 620A, 620B, 620C on the pad portions 502 and frame 504. In some examples, the solder layers 620A, 620B, 620C can be reflowed to create a domed and/or rounded shape. The point of fabrication after completion of block 716 corresponds to the pad region 500 as shown in FIG. 6H. After the deposition of the solder layers 620A, 620B, 620C, the example process of FIG. 7 ends and the pad portions 500 (as shown in FIG. 5A and/or 6G) can be further processed by, for example, attaching the capacitor 108 and/or dies 106A, 106B shown in FIG. 1.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Example capacitor pads and methods of manufacturing the same are disclosed herein. Further examples and combinations thereof include the following:

Example 1 includes an apparatus comprising a substrate to support a die, and a die-side capacitor pad on the substrate, the die-side capacitor pad including a plurality of distinct pad portions, the distinct pad portions spaced apart from one another.

Example 2 includes the apparatus of example 1, further including a die-side capacitor, the die-side capacitor pad to electrical couple the die to a single terminal of the die-side capacitor.

Example 3 includes the apparatus of example 2, further including a frame disposed around the plurality of the distinct pad portions, the frame to retain solder material associated with the die-side capacitor.

Example 4 includes the apparatus of example 1, wherein the distinct pad portions have a same size and a same shape.

Example 5 includes the apparatus of example 1, wherein the distinct pad portions include a first pad portion, the first pad portion having a cylindrical shape.

Example 6 includes the apparatus of example 1, wherein the distinct pad portions include a first pad portion, the first pad portion having a rectangular prism shape.

Example 7 includes the apparatus of example 1, further including a second pad on the substrate, the second pad to bond with a corresponding bump or pad on the die, the second pad having a first size associated with a first cross-sectional area, each of the distinct pad portions having a second size associated with a second cross-sectional area, the second cross-sectional area being less than or equal to the first cross-sectional area.

Example 8 includes an apparatus comprising a substrate to support a die, a capacitor, and an interconnect extending between the capacitor and the substrate, the interconnect including a bump on the capacitor, and a pad on the substrate, the second pad including a plurality of distinct pad portions, the distinct pad portions bonded to the bump on the capacitor.

Example 9 includes the apparatus of example 8, wherein the second pad further includes a frame disposed around the plurality of the distinct pad portions, the frame to retain solder material associated with the bump.

Example 10 includes the apparatus of example 9, wherein the frame is electrically coupled to the distinct pad portions.

Example 11 includes the apparatus of example 8, wherein the distinct pad portions have a same size and a same shape.

Example 12 includes the apparatus of example 8, wherein the distinct pad portions include a first pad portion, the first pad portion having a cylindrical shape.

Example 13 includes the apparatus of example 8, wherein the distinct pad portions include a first pad portion, the first pad portion having a triangular shape.

Example 14 includes the apparatus of example 8, further including a second pad on the substrate, the second pad to electrical couple the substrate to the die, a cross-sectional area of individual ones of the distinct pad portions being less than or equal to a cross-sectional area of the at least one of the second bump or the second pad.

Example 15 includes a method to form a die-side capacitor pad including depositing at least one pillar on an electrical connection on a substrate, and depositing, on the at least one pillar, a plurality of distinct pad portions, the distinct pad portions spaced apart from one another, the distinct pad portions in sufficient proximity to collectively couple to a bump associated with a single terminal of a die-side capacitor.

Example 16 includes the method of example 15, wherein the depositing at least one pillar on the electrical connection includes depositing a plurality of pillars, and the depositing the plurality of distinct pad portions includes depositing a distinct pad portion of the plurality of distinct pad portion on each of the plurality of the pillars.

Example 17 includes the method of example 15, further including depositing a first layer of first material around the at least one pillar, removing a portion of the first layer to expose a surface of the at least one pillar, and patterning a second layer of material on the first layer of material to form a plurality of cavities that open to the exposed surface of the at least one pillar, wherein the depositing the plurality of distinct pad portions includes depositing a second material in ones of the plurality of cavities.

Example 18 includes the method of example 17, further including forming a frame around the plurality distinct pad portions by depositing the second material in a separate one of the plurality of the cavities.

Example 19 includes the method of example 17, wherein the patterning the second layer of material includes defining a cross-sectional shape of a first cavity of the plurality of cavities that corresponds to a cross-sectional shape of corresponding first pad portion of the distinct pad portions, the cross-sectional shape of the first cavity being circular, triangular, or rectangular.

Example 20 includes the method of example 15, wherein the distinct pad portions have a same size and a same shape.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
a substrate to support a die; and
a die-side capacitor pad on the substrate, the die-side capacitor pad including:
a plurality of distinct pad portions, the distinct pad portions spaced apart from one another; and
a frame around the plurality of the distinct pad portions, the frame to retain solder material associated with a die-side capacitor, the frame flush with at least one of the distinct pad portions.

2. The apparatus of claim 1, wherein different ones of the distinct pad portions have a same size and a same shape.

3. The apparatus of claim 1, wherein the distinct pad portions include a first pad portion, the first pad portion having a cylindrical shape.

4. The apparatus of claim 1, wherein the distinct pad portions include a first pad portion, the first pad portion having a rectangular prism shape.

5. The apparatus of claim 1, including a second pad on the substrate, the second pad to bond with a corresponding bump or pad on the die, the second pad having a first size associated with a first cross-sectional area, each of the distinct pad portions having a second size associated with a second cross-sectional area, the second cross-sectional area being less than or equal to the first cross-sectional area.

6. The apparatus of claim 1, wherein the frame includes a conductive material.

7. An apparatus comprising:
a substrate to support a die;
a capacitor including a terminal;
an interconnect extending between the capacitor and the substrate, the interconnect including a first pad on a side of the substrate, the first pad electrically coupling the die to the terminal, the first pad including a plurality of distinct pad portions, each of the distinct pad portions bonded to the terminal of the capacitor; and a second pad on the side of the substrate, the second pad to electrically couple the substrate to the die, a cross-sectional area of individual ones of the distinct pad portions being less than or equal to a cross-sectional area of the second pad.

8. The apparatus of claim 7, wherein the first pad includes a frame around the plurality of the distinct pad portions, the frame to retain solder material that provides the bond between the terminal and each of the distinct pad portions.

9. The apparatus of claim 8, wherein the frame is electrically coupled to at least one of the distinct pad portions.

10. The apparatus of claim 8, wherein the frame includes a conductive material.

11. The apparatus of claim 8, wherein the frame is electrically coupled to the terminal and the die.

12. The apparatus of claim 7, wherein different ones of the distinct pad portions have a same size and a same shape.

13. The apparatus of claim 7, wherein the distinct pad portions include a first pad portion, the first pad portion having a cylindrical shape.

14. The apparatus of claim 7, wherein the distinct pad portions include a first pad portion, the first pad portion having a triangular shape.

15. The apparatus of claim 7, wherein the first pad is a capacitor pad and the second pad is a bridge pad.

16. The apparatus of claim 7, including a first solder layer on the first pad and a second solder layer on the second pad.

17. The apparatus of claim 16, wherein the first solder layer and the second solder layer have a same thickness.

* * * * *